(12) United States Patent
Uratsuji et al.

(10) Patent No.: US 6,673,194 B2
(45) Date of Patent: Jan. 6, 2004

(54) METHOD AND APPARATUS FOR SURFACE PROCESSING OF PRINTED WIRING BOARD

(75) Inventors: Atsuhiro Uratsuji, Ishikawa (JP); Tatsutoshi Narita, Ishikawa (JP); Masanobu Yagi, Ishikawa (JP); Yoshiyuki Ukeda, Ishikawa (JP)

(73) Assignee: Sony Corporation (JP)

( * ) Notice: Subject to any disclaimer, the term of this patent is extended or adjusted under 35 U.S.C. 154(b) by 251 days.

(21) Appl. No.: 09/864,397

(22) Filed: May 25, 2001

(65) Prior Publication Data

US 2002/0014469 A1 Feb. 7, 2002

(30) Foreign Application Priority Data

May 31, 2000 (JP) ..................... P2000-163342

(51) Int. Cl.[7] ............................... B05C 11/00
(52) U.S. Cl. .................. 156/345.2; 451/66; 451/282
(58) Field of Search .................. 156/345.2, 345.22; 216/88, 89, 90; 451/66, 282–290

(56) References Cited

U.S. PATENT DOCUMENTS

| | | | | |
|---|---|---|---|---|
| 3,869,313 A | * | 3/1975 | Jones et al. .................. 134/73 |
| 4,286,860 A | * | 9/1981 | Gursky et al. .............. 396/624 |
| 4,357,196 A | * | 11/1982 | Tanaka et al. ............ 156/345.2 |
| 4,895,099 A | * | 1/1990 | D'Amato ...................... 118/58 |
| 4,999,079 A | * | 3/1991 | Ash ........................ 156/345.2 |

FOREIGN PATENT DOCUMENTS

JP 401117389 * 5/1989

* cited by examiner

Primary Examiner—Gregory Mills
Assistant Examiner—Sylvia R. MacArthur
(74) Attorney, Agent, or Firm—Rader, Fishman & Grauer PLLC; Ronald P. Kananen

(57) ABSTRACT

A printed wiring board having a conductor pattern on which a pre-flux film of a stabilized quality is to be formed using a water-soluble pre-flux liquid. To this end, such an apparatus is used which includes an etching unit 12 for etching lands 5b, 6b formed on the printed wiring board 1, a rinsing unit 13 for rinsing the printed wiring board 1, a bubble removing unit 14 for removing air bubbles 58 attached to the printed wiring board 1 on immersing the printed wiring board 1 in a water-soluble pre-flux liquid 9a in a processing vessel 56, a pre-flux forming unit 15 for forming a pre-flux film 9 on the lands 5b, 6b of the printed wiring board 1 in the pre-flux liquid 9a using an in-liquid spraying unit 61, a liquid removing unit 16 for removing the pre-flux liquid 9a from the printed wiring board 1 transported from the processing vessel 56 and a rinsing unit 17 for rinsing the printed wiring board 1.

8 Claims, 6 Drawing Sheets

| | PROCESS | AGENT USED | TEMPERATURE | TRANSFER SPEED | PROCESSING | SPRAY PRESSURE |
|---|---|---|---|---|---|---|
| STEP1 | WATER WASHING | WELL WATER | AMBIENT | 3m/min | EACH TWO SPRAY UNITS ABOVE AND BELOW | 0.1MPa OR HIGHER |
| STEP2 | SOFT ETCHING | PRT-01 BY MECK INC. (MAIN COMPONENT: SULFURATED WATER) | 30°C | | DIP30s | |
| STEP3 | WATER WASHING | WELL WATER | AMBIENT | | EACH THREE SPRAY UNITS ABOVE AND BELOW | 0.1MPa OR HIGHER |
| STEP4 | ACID WASHING | 5% SULFURIC ACID | AMBIENT | | EACH FOUR SPRAY UNITS ABOVE AND BELOW | 0.2MPa OR HIGHER |
| STEP5 | WATER WASHING | PURE WATER | 35°C | | EACH TWO SPRAY UNITS ABOVE AND BELOW | 0.1MPa OR HIGHER |
| STEP6 | INTERMEDIATE PRESSURE WATER WASHING | PURE WATER | 35°C | | EACH FOUR SPRAY UNITS ABOVE AND BELOW | 0.5MPa OR HIGHER |
| STEP7 | ABUNDANT WATER WASHING | PURE WATER | 35°C | | EACH TWO SPRAY UNITS ABOVE AND BELOW | 5L/cm$^2$·min OR HIGHER |
| STEP8 | FRESH WATER WASHING | PURE WATER | 35°C | | EACH TWO SPRAY UNITS ABOVE AND BELOW | 0.1MPa OR HIGHER |
| STEP9 | AIR BLOWING | | | | | |
| STEP10 | BUBBLE REMOVAL | TERFACE F2 BY SHIKOKU KASEI (MAIN COMPONENTS: AETIC ACID & IMIDAZOLE) | 35°C | | DIP120s+ | |
| STEP11 | PREFLUX | TERFACE F2 BY SHIKOKU KASEI (MAIN COMPONENTS: AETIC ACID & IMIDAZOLE) | 35°C | | EACH TEN SPRAY UNITS ABOVE AND BELOW | 0.1MPa OR HIGHER |
| STEP12 | LIQUID REMOVAL | | | | | |
| STEP13 | FRESH WATER WASHING | PURE WATER | AMBIENT | | EACH THREE SPRAY UNITS ABOVE AND BELOW | 0.1MPa OR HIGHER |
| STEP14 | FRESH WATER WASHING | PURE WATER | AMBIENT | | EACH TWO SPRAY UNITS ABOVE AND BELOW | 0.1MPa OR HIGHER |
| STEP15 | AIR BLOWING | | | | | |
| STEP16 | DRYING | | 150°C | | 30s | |
| STEP17 | COOLING | | AMBIENT | | 20s | |

FIG.4

METHOD AND APPARATUS FOR SURFACE PROCESSING OF PRINTED WIRING BOARD

BACKGROUND OF THE INVENTION

1. Field of the Invention

This invention relates to a method and apparatus for a printed wiring board for forming a protective water-soluble pre-flux film on the surface of a conductor pattern facing outwards.

2. Description of Related Art

In a printed wiring board, a pre-flux film is routinely formed on its conductor pattern following the formation of the conductor pattern and prior to ultimate inspection such as substrate appearance inspection. For forming this pre-flux film, a solvent type pre-flux or a water-soluble pre-flux is used.

Meanwhile, since the solvent type pre-flux, which enables quality stability for the pre-flux film due to its high adhesion to a conductor pattern to assure stabilized film forming and also due to its superior solder wettability, is prepared using a large quantity of the volatile organic compounds (VOCs), the tendency is to use the solvent type pre-flux only in a limited quantity in view of environmental protection.

On the other hand, in a water-soluble pre-flux, not employing the VOCs, sufficient quality stability cannot be realized as compared to the solvent type pre-flux. For example, the water-soluble pre-flux is inferior to the solvent type pre-flux in adhesion to the conductor pattern, such that stable pre-flux films cannot be formed. In addition, the water-soluble pre-flux liquid is inferior in solder wettability.

SUMMARY OF THE INVENTION

It is therefore an object of the present invention to provide a method and apparatus for surface treatment of a printed wiring board capable of forming a pre-flux film of stable quality on a conductor pattern using a water-soluble pre-flux.

In one aspect, the present invention provides a surface-processing apparatus for a printed wiring board including means for etching the surface of a conductor pattern formed on at least one surface of a printed wiring board, first rinsing means for rinsing the surface of the printed wiring board the conductor pattern of which has been etched by the etching means, air bubble removing means for removing air bubbles affixed to the surface of the printed wiring board by immersing the printed wiring board rinsed by the first rinsing means in a water-soluble pre-flux liquid in a processing vessel, pre-flux forming means for forming a pre-flux film on the conductor pattern on the printed wiring board in the pre-flux liquid, freed of air bubbles by the air bubble removing means, using an in-liquid spray provided in the pre-flux liquid in the processing vessel, liquid removing means for removing the pre-flux liquid from the surface of the printed wiring board carrying the pre-flux film and second rinsing means for rinsing the surface of the printed wiring board from the surface of which the pre-flux liquid has been removed by the liquid removing means.

In another aspect, the present invention provides a surface-processing method for a printed wiring board including the steps of etching the surface of a conductor pattern formed on at least one surface of a printed wiring board, rinsing the surface of the printed wiring board the conductor pattern of which has been etched by the etching step, removing air bubbles affixed to the surface of the printed wiring board by immersing the printed wiring board rinsed by the first rinsing step in a water-soluble pre-flux liquid in a processing vessel, forming a pre-flux film on the conductor pattern on the printed wiring board in the pre-flux liquid, freed of air bubbles, using an in-liquid spray provided in the pre-flux liquid in the processing vessel, removing the pre-flux liquid from the surface of the printed wiring board carrying the pre-flux film and transferred from the processing vessel, and rinsing the surface of the printed wiring board from the surface of which the pre-flux liquid has been removed by the liquid removing step.

According to the present invention, the conductor patterns on the printed wiring board are etched to remove surface oxides to provide for a planar surface. The liquid etchant then is rinsed off to form a pre-flux film. So, the pre-flux film may be improved in adhesion, while the pre-flux film is not affected by the surface oxides on the conductor patterns and hence may be a smooth surface. The pre-flux film is formed using an in-liquid spraying unit, so that it may be of uniform film thickness, while solder wettability is also improved.

BRIEF DESCRIPTION OF THE DRAWINGS

FIG. 4 illustrates a step for forming a pre-flux film on a land of the printed wiring board.

DESCRIPTION OF THE PREFERRED EMBODIMENTS

Figure 1:
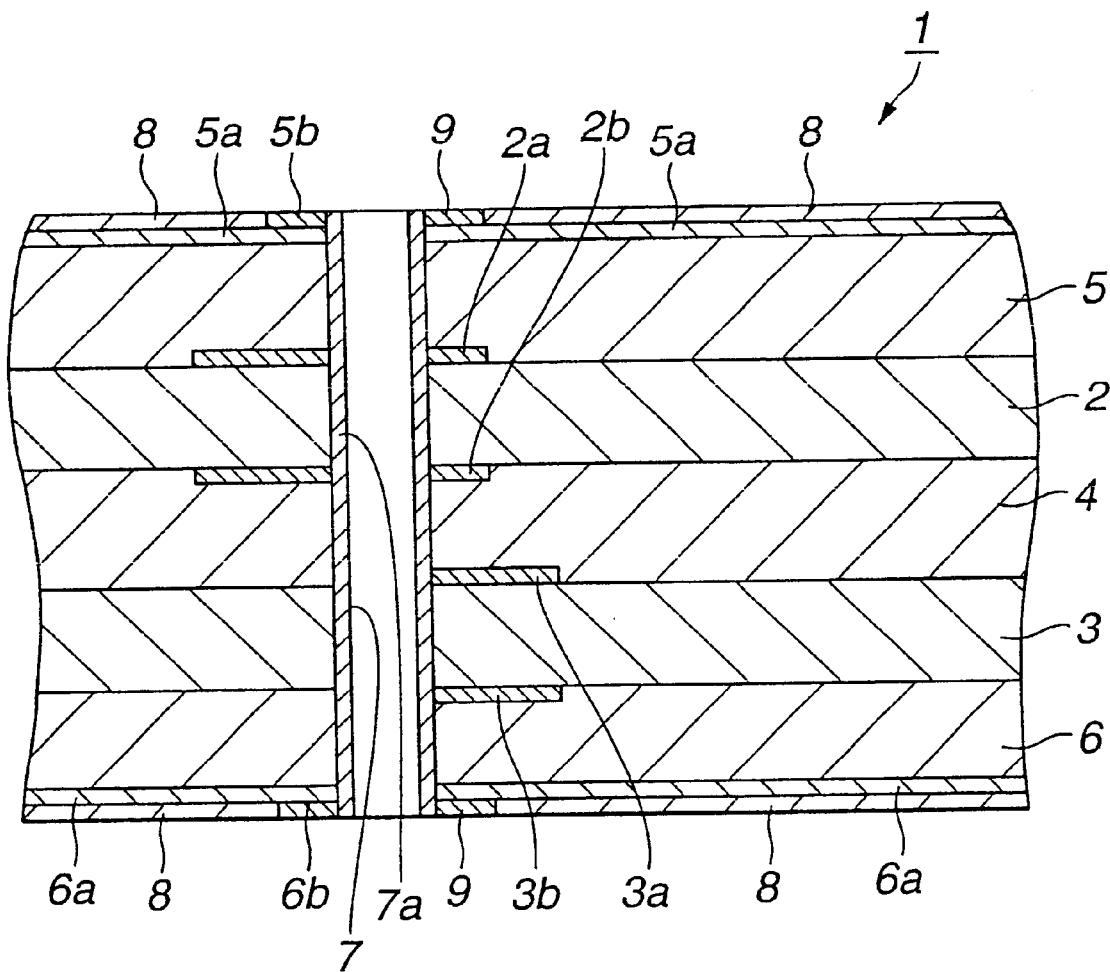
FIG. 1 is a cross-sectional view showing a printed wiring board.

Referring to the drawings, a method and apparatus for surface-processing a printed wiring board for forming a pre-flux film on a land of each of the upper and lower surfaces of the printed wiring board carrying plural conductor patterns according to the present invention will be explained in detail.

Before proceeding to the description of the surface-processing method and apparatus, a printed wiring board used therein is explained. Referring to FIG. 1, the printed wiring board 1 includes inner layer substrates 2, 3. The inner layer substrate 2 includes a conductor pattern 2a, as a second layer, on its one surface, and a conductor pattern 2b, as a third layer, on its opposite surface. The inner layer substrate 3 includes a conductor pattern 3a, as a fourth layer, on its one surface, and a conductor pattern 3b, as a fifth layer, on its opposite surface. The inner layer substrates 2, 3 are pressed together, with the conductor pattern 2b as the third layer facing the conductor pattern 3a as the fourth layer, with the interposition of a pre-preg 4, comprised of glass fibers impregnated with an epoxy resin.

On the inner layer substrate 2 is formed a conductor pattern 5a, as a first layer, with the interposition of an outer layer substrate 5 formed of a pre-preg. On the inner layer substrate 3 is formed a conductor pattern 6a, as a first layer, with the interposition of an outer layer substrate 6 formed of a pre-preg. The outer layer substrate 5, inner layer substrate 2, pre-preg 4, inner layer substrate 3 and the outer layer substrate 6 are layered in this order to form the printed wiring board 1, through which a via-hole 7 is bored, such as with a drill. On the inner wall surface of this via-hole 7, there is formed a plating layer 7a, such as with an electrolytic copper plating method or an electroless copper plating method, to provide for electrical connection between the first layer of the conductor pattern 5a and the second layer of the conductor pattern 2a, by way of an example. On the outer layer substrates 5, 6, there are formed solder resists 8, 8, in such a manner that lands 5b, 6b, as part of the conductor patterns 5a, 6a will face outwards. These lands 5b, 6b are used for mounting electronic components thereon. There are formed protective pre-flux films 9, mainly composed of an imidazole compound, on the lands 5b, 6b.

For preparing the printed wiring board 1, the conductor patterns 2a, 2b are formed on both sides of the inner layer substrate 2, whilst the conductor patterns 3a, 3b are formed on both sides of the inner layer substrate 3. The outer layer substrate 5, having a copper foil bonded to its one surface, the inner layer substrate 2 carrying the conductor patterns 2a, 2b, the prepreg 4, the inner layer substrate 3, carrying the conductor patterns 3a, 3b, and the outer layer substrate 6, having a copper foil bonded to its one surface, are hot-pressed together in vacuum to a unified structure. The via-hole 7 then is bored and the plating layer 7a is formed on the inner wall surface of the via-hole 7, after which conductor patterns 5a, 6a are formed on the outer layer substrates 5 and 6. The solder resists 8, 8 then are applied to the printed wiring board 1 so that the lands 5b, 6b will face outwards. The pre-flux film 9 then is formed on each of the lands 5b, 6b by e.g., a surface-processing device.

Figure 2:
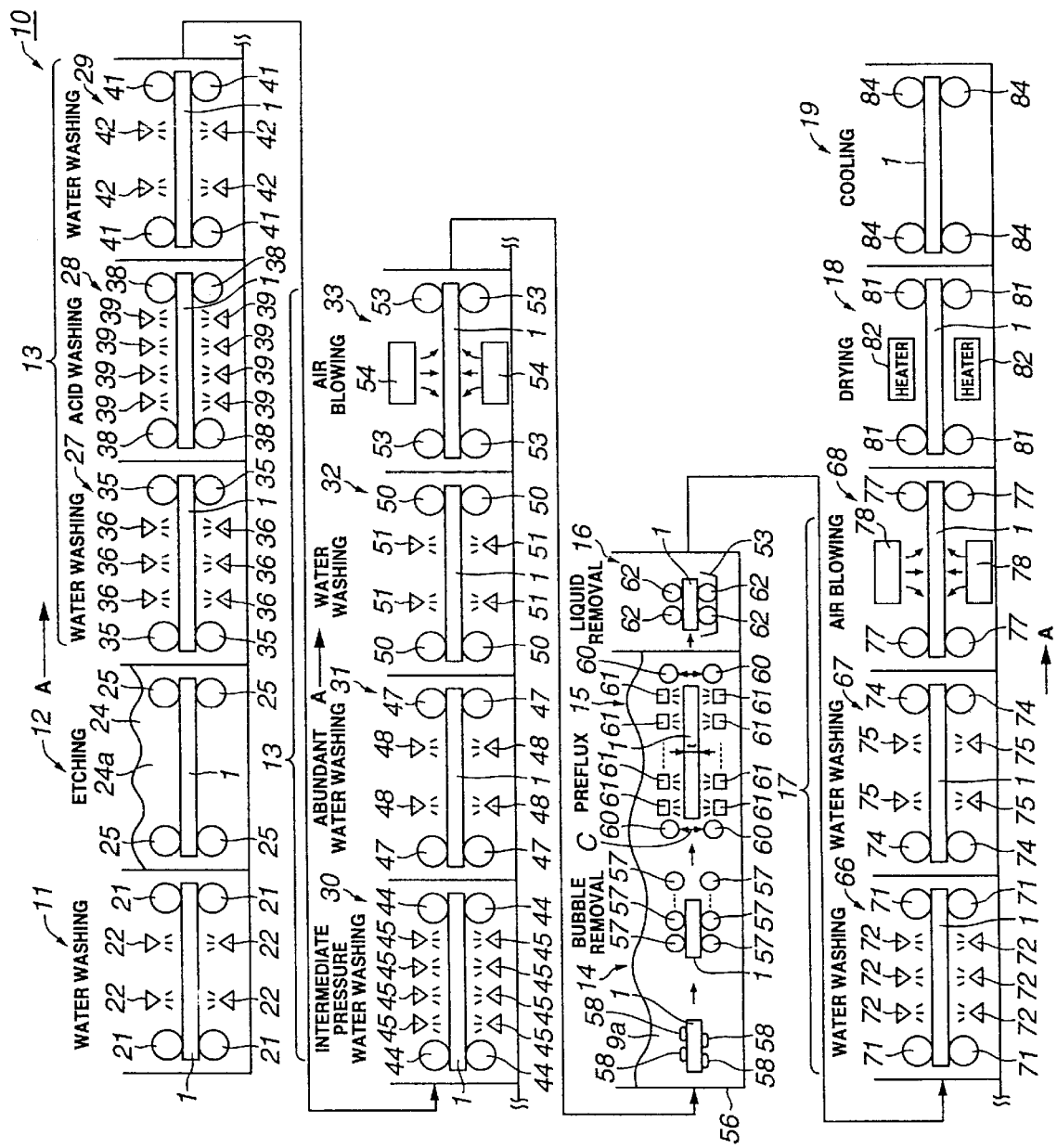
FIGS. 2A to 2D illustrate the structure of a surface processing apparatus for the printed wiring board shown in FIG. 1.

The surface-processing device 10 for forming the pre-flux film 9 surface-processes the lands 5b, 6b of the printed wiring board 1 prior to the formation of the pre-flux films 9, that is the printed wiring board 1 carrying the solder resists 8, 8 on the surfaces of the outer layer substrates 5, 6. Referring to FIG. 2, the surface-processing device 10 includes a rinsing unit 11 for rinsing the printed wiring board 1, coated with the solder resists 8, 8, and an etching unit 12 for etching the lands 5b, 6b, as part of the conductor patterns 5a, 6a, facing outwards from the solder resists 8, 8. The surface-processing device 10 also includes a rinsing unit 13 for rinsing the printed wiring board 1, having its lands 5b, 6b etched by the etching unit 12, and a bubble removing unit 14 for removing the bubbles affixed to the surface of the printed wiring board 1 when the printed wiring board 1 rinsed by the rinsing unit 13 is dipped in a water-soluble pre-flux liquid. The surface-processing device 10 also includes a pre-flux forming unit 15 for forming pre-flux films 9 on the lands 5b, 6b facing outwards from the solder resists 8, 8 of the printed wiring board 1, freed of bubbles by the bubble removing unit 14, and a liquid removing unit 16 for removing the pre-flux liquid from the surface of the printed wiring board 1 on which the pre-flux film 9 has been formed. The surface-processing 10 also includes a rinsing unit 17 for rinsing the printed wiring board 1 carrying the pre-flux films 9 and freed of the liquid by the liquid removing unit 16, a drying unit 18 for drying the printed wiring board 1 washed by the rinsing unit 17, and a cooling unit 19 for cooling the printed wiring board 1 dried by the drying unit 18. The printed wiring board 1 is continuously transported at a speed of 3 m/min in the horizontally laid state, by a transporting unit, in the direction indicated by arrow A in FIG. 2, through the rinsing unit 11, etching unit 12, rinsing unit 13 bubble removing unit 14, pre-flux forming unit 15, liquid removing unit 16, rinsing unit 17, drying unit 18 and the cooling unit 19, in this order. The rinsing unit 11, to which is transported the printed wiring board 1, coated with the solder resists 8, 8 and inspected as to the electrical conducting state, includes a transporting unit 21 for transporting the printed wiring board 1 in the horizontal position, and a spraying unit 22 for spraying the rinsing water, as shown in FIG. 2A. The transporting unit 21 is made up of plural rolls arranged on upper and lower sides of the printed wiring board 1 for holding the printed wiring board 1 transported in the horizontal position. The transporting unit 21 transports the printed wiring board 1 in the direction indicated by arrow A in FIG. 2A at e.g., a transporting speed of 3 m/min for positively rinsing the printed wiring board 1. As for the spraying unit 22, two spraying units are provided on the upper surface side and on the lower surface side of the printed wiring board 1 transported to the transporting unit 21, since the pre-flux films 9 need to be formed on both sides of the printed wiring board 1 and hence the both sides of the printed wiring board 1 need to be rinsed. These spraying units 22 spray well water at ambient temperature under a condition of the spraying pressure not less than 0.1 MPa. Thus, the rinsing unit 11 frees the surface of the printed wiring board 1 of impurities, such as dust and dirt, affixed to the surface of the printed wiring board 1.

The etching unit 12, used for etching the lands 5b, 6b of the printed wiring board 1, the surfaces of which have been washed by the rinsing unit 11, includes a processing vessel 24 in which to store an liquid etchant 24a, and a transporting unit 25 for transporting the printed wiring board 1 through the liquid etchant 24a. The liquid etchant 24a stored in the processing vessel 24 may, for example, be mainly composed of sulfurated water, such as PRT-01 (trade name of a product manufactured by MECK INC). The transporting unit 25 is made up of plural rolls arranged on upper and lower surface sides of the printed wiring board 1 for holding the printed wiring board 1 transported in a horizontal position. The transporting unit 25 transports the printed wiring board 1 at the same transporting speed of 3 m/min as the transporting unit 21 of the rinsing unit 11, in the direction indicated by arrow A in FIG. 2A, in order to positively remove oxides on the surfaces of the lands 5b, 6b by soft etching. The printed wiring board 1 is dipped e.g., for 30 seconds in the liquid etchant 24a at 30° C. so that the lands 5b, 6b as part of the conductor patterns 5a, 6a are etched e.g., by 1.5 to 2.5 μm. The soft etching of the lands 5b, 6b is represented by the following reaction formula:

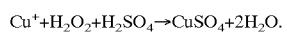

$Cu^+ + H_2O_2 + H_2SO_4 \rightarrow CuSO_4 + 2H_2O.$

This removes oxides affixed to the lands 5b, 6b formed by the conductor patterns 5a, 6a being exposed to outside of the solder resists 8, 8.

Referring to FIGS. 2A and 2B, the rinsing unit 13 for washing the printed wiring board 1, having its lands 5b, 6b etched by the etching unit 12, includes a water washing unit 27 for washing the printed wiring board 1, having its lands 5b, 6b etched, and an acid washing unit 28 for acid-washing the printed wiring board 1 water-washed by the water washing unit 27. The rinsing unit 13 also includes a water washing unit 29 for water-washing the printed wiring board 1, acid-washed by the acid washing unit 28, an intermediate pressure water washing unit 30 for water-washing the printed wiring board 1 at a higher pressure than in the water washing unit 29, and an abundant water washing unit 31 for washing the printed wiring board 1 with an abundant flow of rinsing water. The rinsing unit 13 also includes a second water washing unit 32 for further water-washing the printed wiring board 1 from the abundant water washing unit 31 and an air blower unit 33 for removing the moisture affixed to the surface o the printed wiring board 1.

Referring to FIG. 2A, the water washing unit 27 for water-washing the printed wiring board 1, having the lands 5b, 6b etched by the etching unit 12, includes a transporting unit 35 for transporting the printed wiring board 1 in the horizontal state, and a spraying unit 36 for ejecting rinsing water. A plurality of transporting units 35 are arranged on the upper and lower surface sides of the printed wiring board 1. The transporting unit 35 transports the printed wiring board 1 in the direction indicated by arrow A in FIG. 2A at a transporting speed of, for example, 3 m/min, in order to remove the liquid etchant 24a affixed to the surface of the printed wiring board 1 with the rinsing water ejected from the spraying unit 36. As for the spraying unit 36, three spraying units each are provided on the upper and lower surface sides of the printed wiring board 1, transferred by the transporting unit 35, in order to remove the liquid etchant 24a affixed to both surfaces of the printed wiring board 1. These spraying units 36 spray well water at ambient temperature under a spray pressure of 0.1 MPa or higher. This enables the water washing unit 27 to free the surface of the printed wiring board 1 of the liquid etchant 24a.

Figure 5:
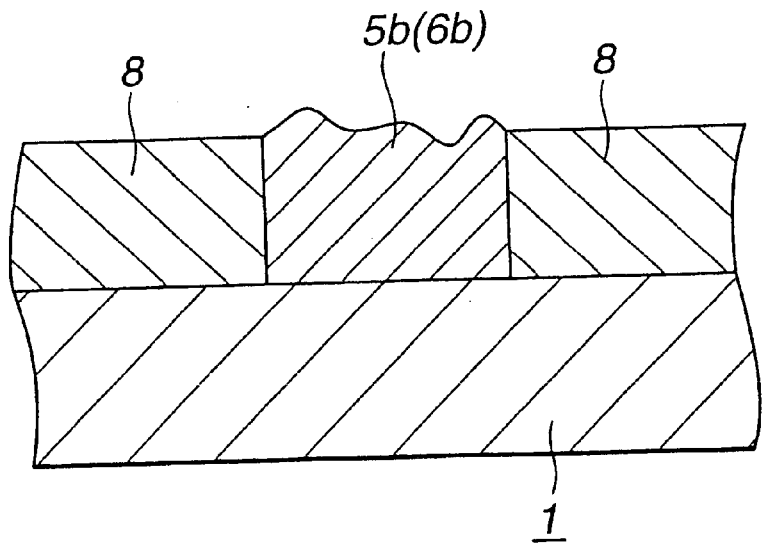
FIG. 5 is a cross-sectional view showing essential parts of the printed wiring board showing the state in which crests and recesses are formed by oxidation of a land surface.
Figure 6:
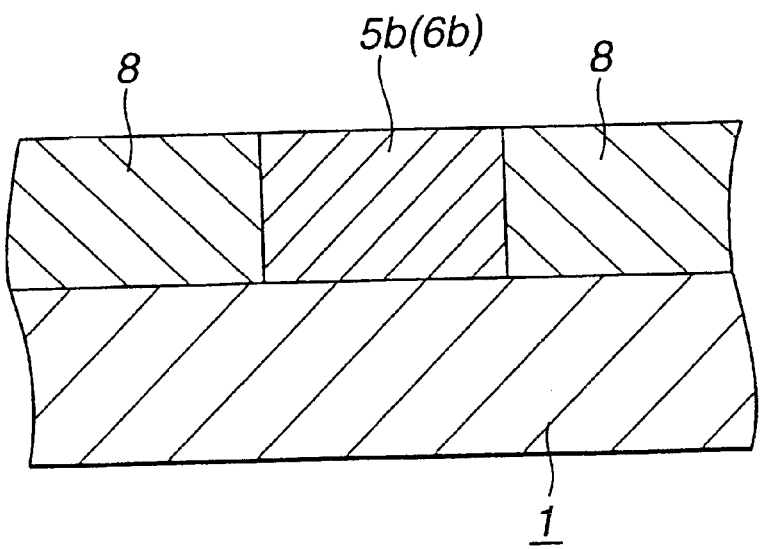
FIG. 6 is a cross-sectional view of a printed wiring board the land surface of which has been flattened out as a result of soft-etching and oxidation of the land surface.

The acid washing unit 28 for acid-washing the printed wiring board 1, freed of the liquid etchant 24a by the water washing unit 27, includes a transporting unit 38 for transporting the printed wiring board 1 in the horizontal position and a spraying unit 39 for ejecting sulfurated water. As for the transporting unit 38, a plurality of transporting units 38 are provided on the upper and lower surface sides of the printed wiring board 1 for clamping the printed wiring board 1 transported in the horizontal position. The transporting units 38 transfer the printed wiring board 1 in the direction indicated by arrow A in FIG. 2A, at a transfer speed of e.g., 3 m/min, in order to positively remove the oxides from the lands 5b, 6b of the printed wiring board 1. As for the spraying units 39, there are provided each four spraying units 39 on the upper and lower surface sides of the printed wiring board 1, being transferred by the transporting unit 35, for positively forming the pre-flux films 9 on the surfaces of the lands 5b, 6b. These spraying units 39 spray the 5% sulfuric acid sulfurated water at room temperature under a spraying pressure not lower than 0.2 MPa. This enables the acid washing unit 28 to positively remove the oxides of the lands 5b, 6b as part of the surface of the printed wiring board 1. That is, the oxides on the lands 5b, 6b are removed positively by being etched by the etching unit 12 and acid-washed by the acid washing unit 28, as shown in FIGS. 5 and 6.

Meanwhile, the sulfurated water is used for removing oxides on the surfaces of the conductor patterns 5a, 6a, as described above, so that, if this sulfurated water is left in the via-hole 7 of the printed wiring board 1, there is a risk that the plating layer 7a formed in the via-hole 7 be oxidized and ruptured. So, the rinsing unit 13 is designed so that, before forming the pre-flux film 9, the sulfurated water will be removed positively by the water washing unit 29, intermediate pressure water washing unit 30, abundant water washing unit 31 and the water washing unit 32.

The water washing unit 29 for water-washing the printed wiring board 1 washed with acid by the acid washing unit 28 includes a transporting unit 41 for transferring the printed wiring board 1 in the horizontal state, and a spraying unit 42 for spraying the rinsing water. As for the transporting unit 41, plural transporting units 41 are provided on the upper and lower surface sides of the printed wiring board 1. The transporting unit 41 transfers the printed wiring board 1 at e.g., a transfer speed of 3 m/min in the direction indicated by arrow A in FIG. 2A for positively rinsing the printed wiring board 1. Since the pre-flux films 9 are formed on the lands 5b, 6b provided on both sides of the printed wiring board 1, two each of the spraying units 42 are provided on the upper and lower surface sides of the printed wiring board 1 transferred by the transporting unit 41. These spraying units 43 spray pure water at 35° C. under a condition of the spraying pressure not less than 0.1 MPa. The pure water at 35° C. is used for improving the water washing effect. If the water temperature is not lower than 35° C., the surfaces of the conductor patterns 5a, 6a tend to be oxidized. So, for washing the printed wiring board 1 until formation of the pre-flux film 9, that is washing by the intermediate pressure water washing unit 30, abundant water washing unit 31 and the water washing unit 32, pure water at 35° C. is used. Thus, the water washing unit 29 removes the sulfurated water from the surface of the printed wiring board 1.

The intermediate pressure water washing unit 30 for further washing the printed wiring board 1 rinsed with water by the water washing unit 29 includes a transporting unit 44 for transferring the printed wiring board 1 in the horizontal position and a spraying unit 45 for ejecting rinsing water. As for the transporting unit 44, plural transporting units 44 are provided on the upper and lower surface sides of the printed wiring board 1 for holding the printed wiring board 1 transferred in the horizontal position. The transporting unit 44 transfer the printed wiring board 1 at e.g., a transfer speed of 3 m/min in the direction indicated by arrow A in FIG. 2B to enable the sulfurated water to be rinsed off from the printed wiring board 1. For rinsing the sulfurated water off from the printed wiring board 1, four spraying units 45 are provided on the upper and lower sides of the printed wiring board 1 transferred by the transporting unit 44. The spraying units 45 spray pure water at 35° C. at a pressure higher than that used for the water washing unit 29, for example, at a spraying pressure not lower than 0.5 MPa. This allows the intermediate pressure water washing unit 30 to remove sulfurated water from the surface of the printed wiring board 1.

The abundant water washing unit 31 for further washing the printed wiring board 1, water-washed by the intermediate pressure water washing unit 30, includes a transporting unit 47 for transferring the printed wiring board 1 in the horizontal state and a spraying unit 48 for ejecting rinsing water. A plurality of transporting units 47 are provided on the upper and lower sides of the printed wiring board 1 transferred by the transporting unit 44. The transporting unit 47 transfers the printed wiring board 1 in the direction indicated by arrow A in FIG. 2B, at a transfer rate of e.g., 3 m/min, to enable the rinsing of the printed wiring board 1. Two each of the spraying units 48 are provided on the upper and lower sides of the printed wiring board 1, transferred by the transporting unit 47, in order to positively rinse sulfurated water off from both sides of the printed wiring board 1. These spraying units 45 spray pure water at 35° C. with a higher water flow rate than the spraying unit 42 of the water washing unit 29, for example, at a water flow rate not less than 5 liters/cm$^2$. This allows the abundant water washing unit 31 to rinse the sulfurated water off from the surface of the printed wiring board 1.

The water washing unit 32 for further washing the printed wiring board l water-washed by the abundant water washing unit 31 includes a transporting unit 50 for transferring the printed wiring board 1 in the horizontal position, and a spraying unit 51 for ejecting the rinsing water. A plurality of the transporting units 50 are provided on the upper and lower sides of the printed wiring board 1 for holding the printed wiring board 1 transferred in the horizontal position. Two each of the spraying units 51 are provided on the upper and lower sides of the printed wiring board 1, transferred by the transporting unit 50, in order to positively rinse sulfurated water off from both sides of the printed wiring board 1. These spraying units 51 spray fresh water at a spray pressure not lower than 0.1 MPa. This allows the water washing unit 29 to remove sulfurated water off from the surface of the printed wiring board 1. Here, new pure water, that is fresh water, is used as rinsing water. Thus, the water washing unit 32 is able to prevent the processing liquid affixed to the printed wiring board 1, that is sulfurated water, from being carried to the next step.

The air blower unit 33 for removing water affixed to the surface of the printed wiring board 1, washed with water by the water washing unit 32, includes a transporting unit 53 for transferring the printed wiring board 1 in the horizontal position, and an air ejection unit 54 for ejecting air to the upper and lower sides of the printed wiring board 1. A plurality of the transporting units 53 are provided on the upper and lower sides of the printed wiring board 1 for holding the printed wiring board 1 transferred in the horizontal position. The transporting unit 53 transfers the printed wiring board 1 at a transfer rate e.g., of 3 m/min in the direction indicated by arrow A in FIG. 2B in order to positively remove the moisture affixed to the the upper and lower sides of the printed wiring board 1. The air ejection unit 54 is provided on each of the upper and lower sides of the printed wiring board 1 to eject air to the upper and lower sides of the printed wiring board 1 transferred by the transporting unit 53 to remove the moisture affixed to the printed wiring board 1. The air blower unit 33 is able to remove the moisture positively from the the upper and lower sides of the printed wiring board 1 prior to formation of the pre-flux film 9.

The printed wiring board 1, positively freed of surface oxides from the lands 5b, 6b by the etching unit 12 and the acid washing unit 28, is washed with water in four stages of different conditions using the water washing unit 29, intermediate pressure water washing mechanism 30, abundant water washing unit 31 and the second water washing unit 32, so that sulfurated water remaining on the surface and especially in the via-hole 7 may be removed reliably. Moreover, the intermediate pressure water washing unit 30 ejects pure water on the upper and lower sides of the printed wiring board 1 under a pressure higher than in the ordinary water washing unit 27 or 29, while the abundant water washing unit 31 ejects pure water at a water flow rate higher than in the ordinary water washing unit 27 or 29, so that sulfurated water can be removed reliably from the printed wiring board 1. In addition, in the rinsing with pure water, pure water at the water temperature of 35° C. is used to improve the water washing effect, while it is possible to prevent oxidation of the surface of the lands 5b, 6b. Thus, with the printed wiring board 1, it is possible to prevent sulfurated water from being left on the lands 5b, 6b to prevent the lands 5b, 6b from being oxidized and roughed, while it is also possible to prevent the plating layer 7a provided in the via-hole 7 from being oxidized and ruptured.

For forming the pre-flux film 9 on the lands 5b, 6b of the printed wiring board 1, freed of surface water by the air blower unit 33, the printed wiring board 1 is immersed in the pre-flux liquid 9a stored in a processing vessel 56, as shown in FIG. 2C. The printed wiring board 1 is transferred to the bubble removing unit 14 and to the pre-flux forming unit 15.

This bubble removing unit 14 removes air bubbles 58 generated on the surface of the printed wiring board 1 when the printed wiring board 1 is immersed in the pre-flux liquid 9a of the processing vessel 56, and includes a processing vessel 56 in which to store the pre-flux liquid 9a and a bubble removing roll 57 operating as a unit for transferring the printed wiring board 1 in the horizontal position through the pre-flux liquid 9a and also for removing air bubbles 58 generated on the surface of the printed wiring board 1 when the printed wiring board 1s immersed in the pre-flux liquid 9a. The pre-flux liquid 9a, stored in the processing vessel 56, is the water-soluble type pre-flux mainly composed of acetic acid and imidazole, such as a pre-flux manufactured by SHIKOKU KASEI CO. LTD. under the trade name of TERFACE F2.

A plurality of bubble removing rolls 57 are provided on the upper and lower sides of the printed wiring board 1 for holding the printed wiring board 1 transferred in the horizontal position. The bubble removing roll 57 transfers the printed wiring board 1 in the direction indicated by arrow A in FIG. 2C at the same transfer speed of 3 m/min as that of the other transporting units 21, 25, 38, 41, 44, 47, 50 and 53. These bubble removing rolls 57 are formed like sponge rolls from e.g., chlorosulfonated polyethylene. The bubble removing roll 57, contacting the printed wiring board 1, is run in rotation to remove air bubbles affixed to the surface of the printed wiring board 1 and is able to form the pre-flux film 9 to a uniform thickness on the lands 5b, 6b at the next step.

The pre-flux forming unit 15 for forming the pre-flux film 9 on the lands 5b, 6b of the printed wiring board 1, immersed in the pre-flux liquid 9a and freed of surface air bubbles 58 by the bubble removing unit 14, includes a processing vessel 56 in which to store the pre-flux liquid 9a, a transporting unit 60 for transferring the printed wiring board 1 transferred in the horizontal position through the pre-flux liquid 9a and an in-liquid spraying unit 61 for spraying the pre-flux liquid 9a, as shown in FIG. 2C.

The transporting unit 60 is made up of plural rolls arranged on the upper and lower sides of the printed wiring board 1 for holding the printed wiring board 1 transferred in the horizontal position. The rolls provided the upper and lower sides of the printed wiring board 1 are arranged with a gap C larger than the thickness t of the printed wiring board 1, in-between, and are designed such that the roll pressure applied to the printed wiring board 1 is decreased and such that no roll marks will be left on the pre-flux film 9 during its formation to enable the pre-flux film 9 to be formed to a uniform thickness. For example, the gap C is set to 0.5 mm or less, preferably to 2 mm. The transporting unit 60 transfers the printed wiring board 1 in the direction indicated by arrow A in FIG. 2C, at a transfer rate e.g., of 3 m/min, as the printed wiring board 1 is immersed in the water-soluble type pre-flux liquid 9a. The printed wiring board 1 is immersed for e.g., 120 seconds in the water-soluble type pre-flux liquid 9a in the processing vessel 56.

For forming the pre-flux film 9 of a uniform film thickness on each of the surfaces of the printed wiring board 1, 10 each of in-liquid spraying units 61 are provided on the upper and lower sides of the printed wiring board 1 transferred by the transporting unit 60. These in-liquid spraying units 61 are comprised of flat nozzles and are of the radiating angle of approximately 90° to permit the water-soluble pre-flux liquid 9a to be ejected over a wide range. These in-liquid spraying units 61 spray the water-soluble pre-flux liquid 9a of 35° C. onto the the upper and lower sides of the printed wiring board 1 under a spraying pressure not less than 0.1 MPa. Since the pre-flux liquid 9a is ejected onto the printed wiring board 1 by the in-liquid spraying units 61 in the pre-flux liquid 9a, the pre-flux film 9 of a uniform film thickness of 0.2 to 0.3 μm is formed on the lands 5b, 6b. The pre-flux film 9, formed on the lands 5b, 6b formed by copper foils, is mainly composed of an imidazole compound, and is formed in accordance with the chemical formula 1:

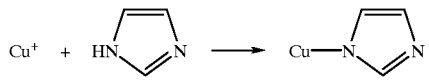

In the previous process, the lands 5b, 6b are soft-etched by the etching unit 12 and further acid-washed by the acid washing unit 28 to remove the surface oxides and to rinse sulfurated water off positively and hence are of flat surfaces. Thus, the pre-flux film 9 adheres to the lands 5b, 6b intimately and is moreover of a flat surface. So, the pre-flux film 9 adherers positively to the lands 5b, 6b and is superior in solder wetting properties.

Figure 3:
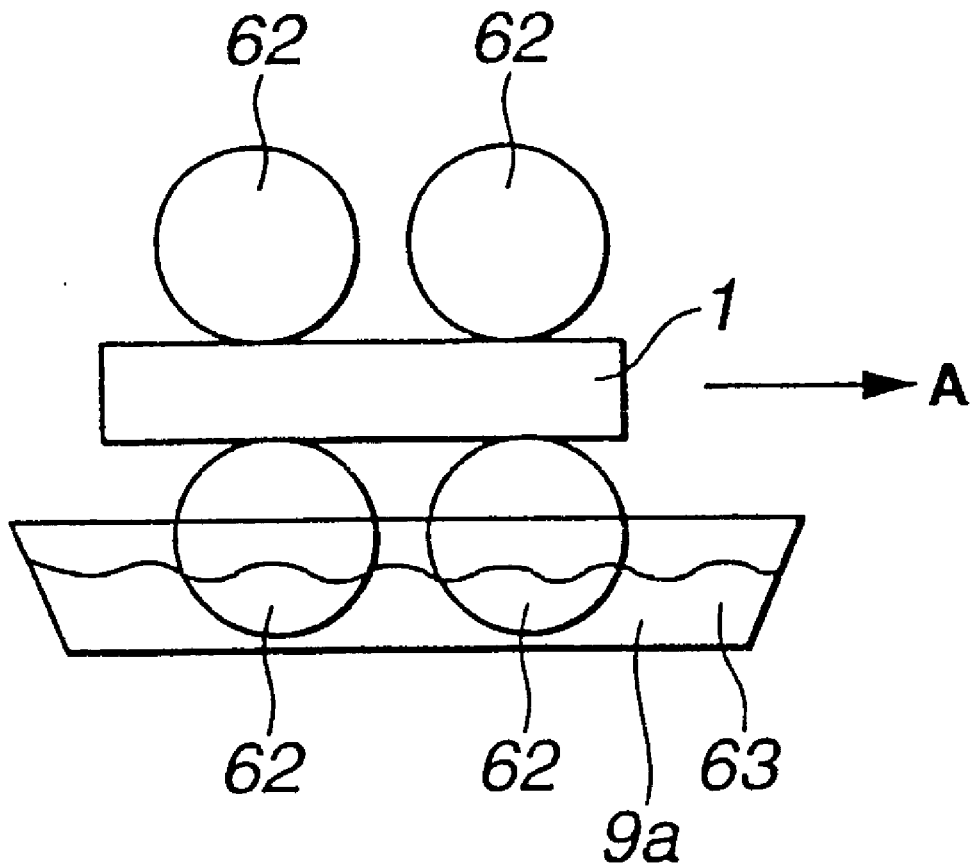
FIG. 3 illustrates a lower saucer provided below the bubble removing roll.

When the pre-flux film 9 has been formed by the lands 5b, 6b by the pre-flux forming unit 15, the printed wiring board 1 is taken out from the processing vessel 56. The printed wiring board 1, taken out from the processing vessel 56, is transferred to the liquid removing unit 16 to remove the liquid attached to its surface. This liquid removing unit 16 serves as a transfer unit for transferring the printed wiring board 1 taken out from the processing vessel 56 in the horizontal position, and includes upper and lower liquid removing rolls 62 for removing the liquid attached to its surface, and a lower saucer 63 arranged below the lower liquid removing roll 62, as shown in FIGS. 2C and 3.

A plurality of the liquid removing rolls 62 are provided on the upper and lower sides of the printed wiring board 1 for holding the printed wiring board 1 transferred in the horizontal position. The liquid removing rolls 62 transfer the printed wiring board 1 in the direction indicated by arrow A in FIGS. 2C and 3 at the same transfer rate e.g., of 3 m/min as that of the other transporting units 21, 25, 38, 41, 44, 47, 50, 53, 57 and 60. The liquid removing rolls 62 are formed as water-absorbent sponge rolls from e.g., chlorosulfonated polyethylene and is designed to apply its own gravity to the printed wiring board 1.

On the lower side of the printed wiring board 1, transferred by the liquid removing rolls 62, there is provided the lower saucer 63 of e.g., vinyl chloride for holding substantially the lower half of the liquid removing rolls 62. Within this lower saucer 63, which is a storage part for the pre-flux liquid 9a, the water-soluble pre-flux liquid 9a is circulated at a rate of 5 to 10 liters/min. This permits the liquid removing rolls 62 to be immersed at all times in the new water-soluble pre-flux liquid 9a to prevent the liquid immersing the liquid removing rolls 62 from being oxidized to exfoliate the pre-flux liquid 9a.

The aforementioned liquid removing unit 16 is able to form the surface of the pre-flux film 9 to a flat shape by the sponge-like liquid removing rolls 62 removing the excess pre-flux liquid 9a affixed to the surface of the printed wiring board 1 when the printed wiring board 1 is taken out of the processing vessel 56. In particular, the lower liquid removing roll 62 is sponge-like and is partially covered by the lower saucer 63 in which is circulated the pre-flux liquid 9a. So, the liquid componewnt, in which is immersed the liquid removing rolls 62, may be prevented from being oxidized to prevent exfoliation of the pre-flux film 9.

The rinsing unit 17 for rinsing the printed wiring board 1, freed of the surface pre-flux liquid 9a by the liquid removing unit 16 and for rinsing the printed wiring board 1 carrying the pre-flux film 9, includes a water washing unit 66 for washing the printed wiring board 1 carrying the pre-flux film 9 , a water washing unit 67 for further water-washing the printed wiring board 1 washed with water by the water washing unit 66, and an air blower unit 68 for removing the moisture affixed to the surface of the printed wiring board 1, as shown in FIG. 2D.

The rinsing unit 66 for washing the printed wiring board 1, carrying the pre-flux film 9, includes a transporting unit 71 for transferring the printed wiring board 1 transferred in the horizontal position, and a spraying unit 72 for ejecting the rinsing water, as shown in FIG. 2D. A plurality of the transporting unit 71 are arranged on the upper and lower sides of the printed wiring board 1 for holding the printed wiring board 1 transferred in the horizontal position. The transporting unit 71 transfers the printed wiring board 1 at a transfer rate e.g., of 3 m/min in the direction indicated by arrow A in FIG. 2D for removing unneeded pre-flux liquid 9a affixed to the surface of the printed wiring board 1 and which has not been removed by the liquid removing unit 16. Three of the spraying units 72 are provided on the upper and lower sides of the printed wiring board 1, transferred by the transporting unit 71, for removing the pre-flux liquid 9a affixed to the surface of the printed wiring board 1. These spraying units 72 spray new water, that is fresh pure water, at ambient temperature, under a spraying pressure not less than 0.1 MPa. This pennits the water washing unit 66 to remove the pre-flux liquid 9a from the surface of the printed wiring board 1. On the other hand, by using fresh water, the pre-flux liquid 9a may be prevented from being carried to the next process step.

The second water washing unit 67 for further water-washing the printed wiring board 1, water-washed by the water washing unit 66, includes a transporting unit 74 for transferring the printed wiring board 1 transferred in the horizontal position and a spraying unit 75 for ejecting the rinsing water. A plurality of the transporting unit 74 are provided on the upper and lower sides of the printed wiring board 1 for holding the printed wiring board 1 transferred in the horizontal position. The transporting unit 74 transfers the printed wiring board 1 at a transfer rate e.g., of 3 m/min in the direction indicated by arrow A in FIG. 2D for removing unneeded pre-flux liquid 9a affixed to the surface of the printed wiring board 1 and which has not been removed by the liquid removing unit 66. Two each of the spraying units 75 are provided on the upper and lower sides of the printed wiring board 1, transferred by the transporting unit 74, for removing the pre-flux liquid 9a affixed to the surface of the printed wiring board 1. These spraying units 72 spray new water at ambient temperature, under a spraying pressure not less than 0.1 MPa, that is, the water washing unit 67 uses the new rinsing water, that is fresh water, without using the rinsing water used in the water washing unit 66, for preventing the processing liquid, that is the pre-flux liquid 9a, from being carried into the water washing unit 67 to make the rinsing water acidic to peel off the pre-flux film 9. This permits the water washing unit 67 to remove the pre-flux liquid 9a positively from the surface of the printed wiring board 1.

The air blower unit 68 for removing the moisture affixed to the surface of the printed wiring board 1, washed with water by the water washing unit 67, includes a transporting mechanism 77 for transferring the printed wiring board 1 in the horizontal position, and air blowers 78 for ejecting air onto the upper and lower sides of the printed wiring board 1. A plurality of the transporting units 77 are provided on the upper and lower sides of the printed wiring board 1 for holding the printed wiring board 1 transferred in the horizontal position. The transporting unit 77 transfers the printed wiring board 1 in the direction indicated by arrow A in FIG. 2D at a transfer rate e.g., of 3 m/min in order to positively remove the moisture affixed to the printed wiring board 1. The air blowers 78 are provided on the upper and lower sides of the printed wiring board 1 for positively ejecting air onto the upper and lower sides of the printed wiring board 1 of the printed wiring board 1 transferred by the transporting unit 77. The air blower unit 68 is able to remove the moisture positively from the upper and lower sides of the printed wiring board 1 carrying the pre-flux film 9.

The drier unit 18 for drying the printed wiring board 1, completely freed of the unneeded pre-flux liquid by water washing, includes a transporting unit 81 for transferring the printed wiring board 1 in the horizontal position and a heater 82 for heating the the upper and lower sides of the printed wiring board 1. A plurality of the transporting units 81 are provided on the upper and lower sides of the printed wiring board 1. The transporting unit 81 transfers the printed wiring board 1 in the direction indicated by arrow A in FIG. 2D at a transfer rate e.g., of 3 m/min for positively removing the moisture affixed to the printed wiring board 1. The heater 82 heats the inside of a processing chamber to approximately 150° C. The printed wiring board 1, transferred by the transporting unit 81, is positively dried by heating for approximately 30 seconds.

The cooling unit 19 for cooling the printed wiring board 1 from the drying unit 18 includes a transporting unit 84 for transferring the printed wiring board 1 in the horizontal position. A plurality of transporting units 84 are mounted on the upper and lower sides of the printed wiring board 1 for holding the printed wiring board 1 transferred in the horizontal position. The transporting unit 84 cools the printed wiring board 1 at ambient temperature for approximately 20 seconds at a transfer rate e.g., of 3 m/min.

The method for forming the pre-flux film 9 on the lands 5b, 6b using the surface-processing device 10 constructed as described above is now explained by referring to FIGS. 2A to 2D.

First, at step S1,the printed wiring board 1, coated with the solder resists 8, 8 and tested for current conduction, is transferred by a transporting unit, not shown, to the rinsing unit 11. The printed wiring board 1 is transferred by a transporting unit 21 at a transfer rate e.g., of 3 m/min and rinsed as the well water at ambient temperature is sprayed thereon under a spraying pressure not less than 0.1 MPa by each two spraying units 22 provided on the upper and lower sides of the printed wiring board 1. This removes foreign matter, such as dust and dirt, deposited on the surface of the printed wiring board 1 prior to formation of the pre-flux film 9. The printed wiring board 1 thus rinsed is transferred from the transporting unit 21 to the transporting unit 25 of the etching unit 12.

Meanwhile, the lands 5b, 6b present irregularities due to surface oxidation, as shown in FIG. 5. If the pre-flux film 9 is formed on the lands 5b, 6b in a state shown in FIG. 5, the pre-flux film 9 is inferior in adhesion to the lands 5b, 6b. Moreover, the irregularities on the lands 5b, 6b affect the pre-flux film 9 such that the surface of the pre-flux film 9 is also indented to worsen solder wettability. So, the lands 5b, 6b are planarized by acid-washing their surfaces by soft etching to remove surface irregularities, that is oxides.

That is, the lands 5b, 6b of the printed wiring board 1, having their surfaces washed, are soft-etched at step S2 by the etching unit 12. Specifically, the printed wiring board 1 is transferred at a transfer rate e.g., of 3 m/min through the liquid etchant 24a in the processing vessel 24, mainly composed of sulfurated water, whereby the copper foils making up the lands 5b, 6b are etched by 1.5 to 2.5 $\mu$m in 30 seconds. This removes the oxides affixed to the lands 5b, 6b. The printed wiring board 1, the lands 5b, 6b of which have been soft-etched, is transferred from the transporting unit 25 to a transporting unit 35 of the water washing unit 27.

The printed wiring board 1, the lands 5b, 6b of which have been etched by the etching unit 12, is freed at step S3 of the liquid etchant 24a affixed to the entire surface of the printed wiring board 1 by the water washing unit 27. That is, as the printed wiring board 1 is transferred by the transporting unit 35 at a transfer rate e.g., of 3 m/min, well water at ambient temperature is sprayed under a spraying pressure not less than 0.1 MPa by each three spraying units 36 provided the upper and lower sides of the printed wiring board 1, whereby the excess liquid etchant 24a affixed to the surface of the printed wiring board 1 is removed. The printed wiring board 1, rinsed by the water washing unit 27, is transferred from the transporting unit 35 to a transporting unit 38 of the acid washing unit 28.

The printed wiring board 1, freed of the liquid etchant 24a by water washing by the water washing unit 27, is freed at step S4 of oxides on the lands 5b, 6b by the acid washing unit 28. Specifically, as the printed wiring board 1 is transferred at a transfer rate e.g., of 3 m/min by the transporting unit 38, 5% sulfuric acid sulfurated water at ambient temperature is sprayed on the upper and lower sides of the printed wiring board 1 under a spraying pressure not less than 0.2 MPa by each four spraying units 39 provided on the upper and lower sides of the printed wiring board 1, whereby the oxides of the lands 5b, 6b may be removed positively.

That is, the surfaces of the lands 5b, 6b are soft-etched at step S2 by the etching unit 12 and acid-washed at step S4 by the acid washing unit 28. That is, the two-stage oxide removing process positively removes the oxides to planarize the surface of the lands 5b, 6b. This improves adhesion of the pre-flux film 9 to the lands 5b, 6b, while also improving solder wettability.

Meanwhile, the sulfurated water is used for removing surface oxides on the lands 5b, 6b, as described above, so that, if this sulfurated water is left in the via-hole 7 of the printed wiring board 1, the plating layer 7a provided in the via-hole 7 tends to be oxidized and ruptured. So, at step S5, the printed wiring board 1, the lands 5b, 6b of which have been acid-washed by the acid washing unit 28 and which has been transferred by the transporting unit 38, is water-washed by the water washing unit 38. That is, as the printed wiring board 1 is transferred at a transfer rate e.g., of 3 m/min by the transporting unit 41, pure water at 35° C. is ejected under a spraying pressure not less than 0.1 MPa by each two spraying units 42 provided on the upper and lower sides of the printed wiring board 1. This rinses sulfurated water off from the printed wiring board 1. The printed wiring board 1, washed with water by the water washing unit 29, is transferred from the transporting unit 38 to a transporting unit 44 of the intermediate pressure water washing unit 30.

The printed wiring board 1, water-washed at step S6 by the water washing unit 29, is water-washed at a high ejection pressure by the spraying units 42 of the water washing unit 29 of the intermediate pressure water washing unit 30. Specifically, the printed wiring board 1 is transferred by the transporting unit 44 at a transfer rate e.g., of 3 m/min and has its upper and lower surfaces sprayed with pure water at 35° C. under a spraying pressure not less than 0.5 MPa by each four spraying units 45 provided on the upper and lower sides of the printed wiring board 1. This rinses the sulfurated water off from the printed wiring board 1. The printed wiring board, washed with water by the intermediate pressure water washing unit 30, is transferred from the transporting unit 44 to the transporting unit 47 of the abundant water washing unit 31.

The printed wiring board 1, washed with water by the intermediate pressure water washing mechanism 30, is washed at step S7 with an abundant flow of water by the spraying units 42 of the water washing unit 29 of the abundant water washing unit 31. Specifically, the printed wiring board 1 is transferred by the transporting unit 47 at a transfer rate e.g., of 3 m/min and sprayed with 35° C. pure water at a flow rate not less than 5 lit/cm² by each two spraying units provided on the upper and lower sides of the printed wiring board 1. This rinses sulfurated water off from the printed wiring board 1. The printed wiring board 1, washed with water by the abundant water washing unit 31, is transferred from the transporting unit 47 to the transporting unit 50 of the abundant water washing unit 32.

Att the next step S8, the printed wiring board 1, washed with water by the abundant water washing unit 31, is washed with new water by the water washing unit 32. That is, as the printed wiring board 1 is transferred by the transporting unit 50 at a transfer rate e.g., of 3 m/min, it is sprayed with fresh water at 35° C. under a spraying pressure not less than 0.1 MPa by each two spraying units 51 provided the upper and lower sides of the printed wiring board 1. This completely rises sulfurated water off from the printed wiring board 1. Here, new pure water, that is fresh water, is used as the rinsing water, to prevent the processing liquid, that is sulfurated water, affixed to the printed wiring board 1, from being carried to the following process step. The printed wiring board 1, washed with water by the water washing unit 32, is transported from the transporting unit 50 to the transporting unit 53 of the air blower unit 33.

The printed wiring board 1, washed with fresh water by the water washing unit 32, is freed at step S9 of water affixed to its surface by the air blower unit 33. Specifically, as the printed wiring board 1 is transferred by the transporting unit 53 at a transfer rate e.g., of 3 m/min, air is ejected from an air blower 54 onto the upper and lower sides of the printed wiring board 1 to remove the moisture positively from the upper and lower sides of the printed wiring board 1 immediately before formation of the pre-flux film 9.

By the four stages of water washing under different conditions employing the water washing unit 29, intermediate pressure water washing unit 30, abundant water washing unit 31 and the second water washing unit 32 at steps S5 to S8, the sulfurated water left on the surface of the printed wiring board 1, especially in the via-hole 7, may be removed positively. Moreover, in the rinsing at the steps S5 to S8 employing pure water at 35° C., the water-washing effect may be improved, whilst surface oxidation of the lands 5b, 6b may be prevented from occurring. By using fresh water as the rinsing water at step S8, the processing liquid affixed to the printed wiring board 1, that is sulfurated water, may be prevented from being transferred to the next step.

Thus, with the printed wiring board 1, it is possible to prevent the lands 5b, 6b, planarized by soft etching at step S2 and acid washing at step S4, from being oxidized and being again hardened in its surface by the sulfurated water left on the lands 5b, 6b. Moreover, with the printed wiring board 1, it is possible to prevent the plating layer 7a in the via-hole 7 from being oxidized and ruptured. On the lands 5b, 6b, thus planarized, there is then formed the pre-flux film 9.

That is, the printed wiring board 1, freed of redundant water by the air blower unit 33, is transported from the transporting unit 53 of the air blower unit 33 to a transporting unit, comprised of the bubble removing rolls 57 of the bubble removing unit 14, so as to be immersed in the pre-flux liquid 9a stored in the processing vessel 56. At this time, air bubbles 58 are generated on the surface of the printed wiring board 1. If the pre-flux film 9 is formed as the air bubbles 58 are generated in this manner, the pre-flux film 9 cannot be formed to a uniform film thickness. So, the printed wiring board 1, on the surface of which are attached the air bubbles 58, is transferred at a transfer rate e.g., of 3 m/min by the bubble removing rolls 57 provided on the upper and lower sides of the printed wiring board 1 for removing the air bubbles 58. The printed wiring board 1, freed of the air bubbles 58 on immersion in the pre-flux liquid 9a in the processing vessel 56, is transferred from the transporting unit comprised of the bubble removing rolls 57 to the transporting unit 60 of the pre-flux forming unit 15.

Figure 7:
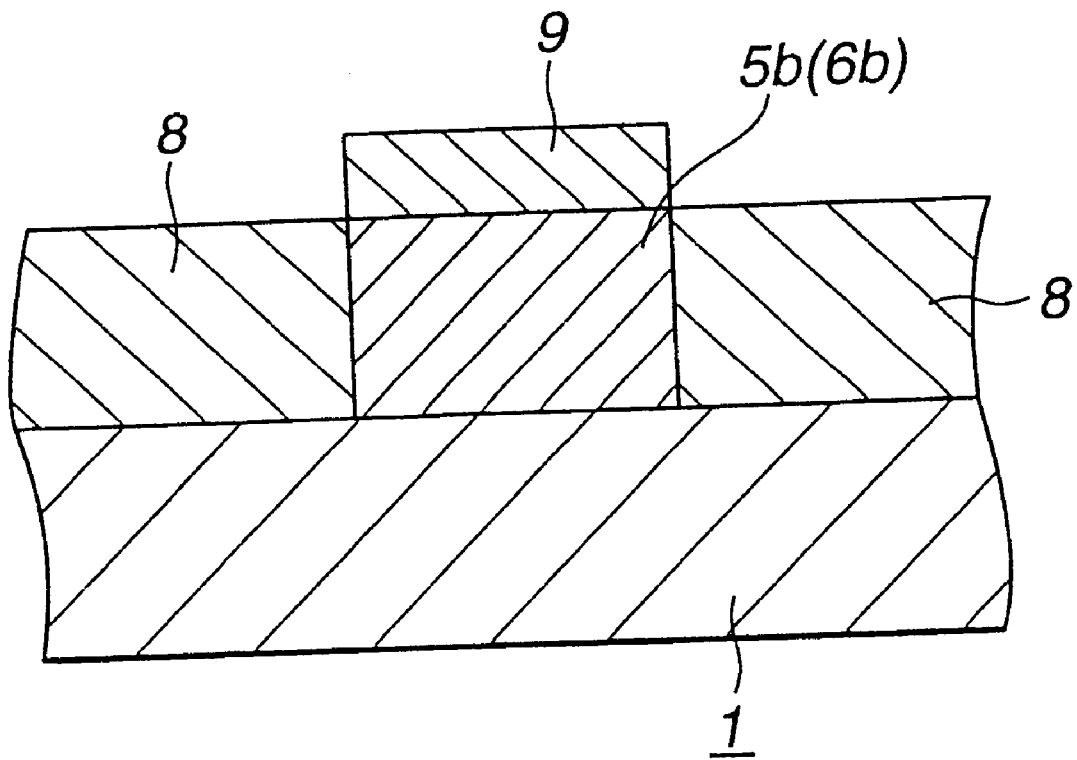
FIG. 7 is a cross-sectional view showing the state of formation of a pre-flux film on the land surface.

On the lands 5b, 6b of the printed wiring board 1, from the surface of which the air bubbles 58 have been removed, the pre-flux film 9 is formed at step S11 by the pre-flux forming unit 15. Specifically, as the printed wiring board 1 is transferred by the transporting unit 60 at a transfer rate e.g., of 3 m/min through the water-soluble pre-flux liquid 9a in the processing vessel 56, mainly composed of acetic acid and imidazole on the surface of the printed wiring board 1 in the pre-flux liquid 9a, the water-soluble pre-flux liquid at 35° C. is sprayed under a spraying pressure not less than 0.1 MPa by each ten in-liquid spraying units 61 provided on the upper and lower sides of the printed wiring board 1. This forms the pre-flux film 9, mainly composed of the imidazole compound, to a uniform film thickness of 0.2 to 0.3 $\mu$m, on the lands 5b, 6b. Since these lands 5b, 6b are formed to flat surfaces by soft etching at step S2 and by acid washing at step S4, as previous steps, as shown in FIG. 7, the pre-flux film 9 is intimately affixed to the lands 5b, 6b and formed to a planar surface. This enables the pre-flux film 9 to be generated with high adhesion properties with respect to the lands 5b, 6b and excellent solder wettability. The upper and lower paired rolls, making up the transporting unit 60, are arranged at the intervals larger than the thickness of the printed wiring board 1. So, the roll pressure applied to the surface of the printed wiring board 1 is reduced to prevent roll marks from being left on the surface of the pre-flux film 9 being formed to rough the surface. The printed wiring board 1, now carrying the pre-flux film 9 on its lands 5b, 6b, is transferred from the transporting unit 60 to the liquid removing unit 16. Meanwhile, the printed wiring board 1 is immersed for 120 seconds in the pre-flux liquid 9a in the processing vessel 56.

At step S12, the printed wiring board 1, now carrying the pre-flux film 9, is taken out from the processing vessel 56, and transferred to the liquid removing rolls 62 making up the liquid removing unit 16 for removing the redundant portion of the pre-flux liquid 9a. That is, the printed wiring board 1, carrying the pre-flux liquid 9a, is passed through the sponge-like liquid removing rolls 62 so as to be thereby freed of the unneeded portion of the pre-flux liquid 9a. The lower liquid removing roll 62 below the printed wiring board 1 is partially hidden in the lower saucer 63 in which is circulated the pre-flux liquid 9a. So, the fresh pre-flux liquid 9a is circulated at all times in the lower saucer 63 to prevent the liquid component immersing the liquid removing roll 62 from being oxidized to cause peeling of the pre-flux film 9. The printed wiring board 1, freed of the surface pre-flux liquid 9a, is transferred to a transporting unit 71 of the water washing unit 66 from the liquid removing rolls 62 also operating as transporting means.

The printed wiring board 1, freed of the surface pre-flux liquid 9a by the liquid removing unit 16, is freed at step S13 of the redundant portion of the pre-flux liquid 9a affixed to its surface by the water washing unit 66. Specifically, as the printed wiring board 1 is transferred by the transporting unit 71 at a transfer rate e.g., of 3 m/min, it is sprayed with new water at ambient temperature, that is new fresh water, under a spraying pressure not less than 0.1 MPa, by each three spraying units 71 provided on the the upper and lower sides of the printed wiring board 1. This rinses the pre-flux liquid off from the printed wiring board 1. By using fresh water for water washing in this step, the pre-flux liquid 9a is prevented from being transferred to the next step. The printed wiring board 1, washed with water by the water washing unit 66, is transported from the transporting unit 71 to the transporting unit 74 of the water washing unit 67.

The printed wiring board 1, washed with water at step S14 by the water washing unit 66, is freed of excess pre-flux liquid 9a, affixed to its surface, by the water washing unit 67. Specifically, as the printed wiring board 1 is transferred by the transporting unit 74 at a transfer rate e.g., of 3 m/min, it is sprayed with new water at ambient temperature, that is new fresh water, under a spraying pressure not less than 0.1 MPa, by each two spraying units 71 provided on the the upper and lower sides of the printed wiring board 1. This completely rinses the pre-flux liquid off from the printed wiring board 1. By using fresh water for water washing in this step, the pre-flux liquid 9a is prevented from being transferred to the next step. The printed wiring board 1, washed with water by the water washing unit 66, is transported from the transporting unit 74 to the transporting unit 77 of the air blower unit 68.

The printed wiring board 1, now carrying the pre-flux film 9, is washed with water in two stages by the water washing units 66, 67, whereby the excess pre-flux liquid 9a affixed to its surface can be removed positively. By using fresh water as rinsing water at the time of removing the excess pre-flux liquid 9a attached to the printed wiring board 1 at steps S12 and S13, the pre-flux liquid 9a may be prevented from being transferred to the next step.

The printed wiring board 1, washed with new water by the water washing unit 67, is freed of the moisture affixed to its surface by the air blower unit 68. Specifically, as the printed wiring board 1 is transferred by the transporting unit 77 at a transfer rate e.g., of 3 m/min, air is ejected by the air blowers 78 onto the upper and lower sides of the printed wiring board 1 to remove the moisture positively from the upper and lower sides of the printed wiring board 1.

The printed wiring board 1, freed of the excess moisture by the air blower unit 68, is dried at step S16 by the drier unit 18. That is, as the printed wiring board 1 is transferred by the transporting unit 84 at a transfer rate e.g., of 3 m/min, it is cooled at ambient temperature for approximately 20 seconds at ambient temperature.

At step S17, the printed wiring board 1 from the drying unit 18 is cooled by a cooling unit 19. That is, the present printed wiring board 1 is transferred by the transporting mechanism 84 at a transfer rate e.g., of 3 m/min and cooled at ambient temperature for approximately 20 seconds.

In the above-described surface-processing method and apparatus 10 for forming the water-soluble pre-flux film 9 on the lands 5b, 6b, the lands 5b, 6b are soft-etched by the etching unit 12 at step S2 and substantially acid-washed by the acid washing unit 28, by way of performing two-stage oxide removing step, whereby the oxides may be positively removed and the lands 5b, 6b are processed to a planar surface, as shown in FIG. 6. By the four stages of water washing at steps S5 to S8 under different conditions employing the water washing unit 29, intermediate pressure water washing unit 30, abundant water washing unit 31 and the second water washing unit 32, the sulfurated water left on the surface of the printed wiring board 1, especially in the via-hole 7, may be removed positively.

So, with the printed wiring board 1, it is possible to prevent the lands 5b, 6b, planarized by soft etching at step S2 and acid washing at step S4, from being oxidized and being again roughed in its surface by the sulfurated water left on the lands 5b, 6b. Moreover, with the printed wiring board 1, it is possible to prevent the plating layer 7a in the via-hole 7 from being oxidized and ruptured. By forming the pre-flux film 9 on the lands 5b, 6b, processed to planar surfaces, as shown in FIG. 6, it is possible to form the pre-flux film 9 having improved adhesion to the lands 5b, 6b, while it is possible to planarize the surface of the pre-flux film 9 to improve its solder wettability.

Although the foregoing description is made of a multi-layered printed wiring board, having the lands 5b, 6b formed on its upper and lower sides, the present invention may also be applied to the forming of the pre-flux film 9 on a land of a printed wiring board carrying an electrically conductive layer on only one surface thereof.

What is claimed is:

1. A surface-processing apparatus for a multilayer printed wiring board comprising:

means for etching the surface of a conductor pattern formed on at least one outer layer of a printed wiring board;

first rinsing means for rinsing the surface of the printed wiring board the conductor pattern of which has been etched by said etching means;

air bubble removing means for removing air bubbles affixed to the surface of the printed wiring board by immersing the printed wiring board rinsed by said first rinsing means in a water-soluble pre-flux liquid in a processing vessel;

pre-flux forming means for forming a pre-flux film on said conductor pattern of said outer layer of said printed wiring board in the pre-flux liquid, freed of air bubbles by said air bubble removing means, using an in-liquid spray provided in said pre-flux liquid in said processing vessel;

liquid removing means for removing the pre-flux liquid from the surface of said printed wiring board carrying said pre-flux film; and second rinsing means for rinsing the surface of said printed wiring board from the surface of which said pre-flux liquid has been removed by said liquid removing means.

2. The surface-processing apparatus for a printed wiring board according to claim 1 wherein said etching means removes the surface of said conductor pattern by 1.5 to 2.5 μm.

3. The surface-processing apparatus for a printed wiring board according to claim 1 wherein said first rinsing means rinses the surface of the printed wiring board, the conductor pattern of which has been etched, with acid, then rinses the acid-rinsed surface with water under a condition of not less than 0.5 MPa/cm2 and subsequently rinses the water-washed surface with water under a condition of not less than 5 lit/cm2 min.

4. The surface-processing apparatus for a printed wiring board according to claim 3 wherein said water washing is with pure water not lower than 35 C.

5. The surface-processing apparatus for a printed wiring board according to claim 1 wherein said pre-flux film is mainly composed of an imidazole compound and is formed to a thickness of 0.2 to 0.3 µm on said conductor pattern.

6. The surface-processing apparatus for a printed wiring board according to claim 1 wherein said air bubble removing means is a sponge-like roll.

7. The surface-processing apparatus for a printed wiring board according to claim 1 wherein said pre-flux forming means transfers said printed wiring board using upper and lower paired rolls provided at a spacing from each other larger than the thickness of the printed wiring board.

8. The surface-processing apparatus for a printed wiring board according to claim 1 wherein said liquid removing means includes a sponge-like roll and a lower saucer in which said pre-flux liquid is stored in circulation on said lower saucer holding said sponge like roll, such that half of said sponge like roll is immersed in said pre-flux liquid.

* * * * *